(12) United States Patent
Doylend et al.

(10) Patent No.: US 10,833,481 B2
(45) Date of Patent: Nov. 10, 2020

(54) LASER DEVICE WITH A STEPPED GRADED INDEX SEPARATE CONFINEMENT HETEROSTRUCTURE

(71) Applicant: Intel Corporation, Santa Clara, CA (US)

(72) Inventors: Jonathan K. Doylend, Morgan Hill, CA (US); Pierre Doussiere, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/235,684

(22) Filed: Dec. 28, 2018

(65) Prior Publication Data

US 2019/0140426 A1 May 9, 2019

(51) Int. Cl.
*H01S 5/34* (2006.01)
*H01S 5/343* (2006.01)
(Continued)

(52) U.S. Cl.
CPC .......... *H01S 5/3409* (2013.01); *H01S 5/1032* (2013.01); *H01S 5/2018* (2013.01); *H01S 5/2031* (2013.01); *H01S 5/2231* (2013.01); *H01S 5/34313* (2013.01); *H04B 10/40* (2013.01); *H01S 5/0085* (2013.01); *H01S 5/021* (2013.01); *H01S 5/02284* (2013.01);
(Continued)

(58) Field of Classification Search
CPC .................................................. H01S 5/3409
See application file for complete search history.

(56) References Cited

U.S. PATENT DOCUMENTS

2015/0092800 A1* 4/2015 Zucker .................. H01S 5/0265
372/29.015
2015/0270684 A1* 9/2015 Suzuki .................. H01S 5/1237
372/45.012
(Continued)

OTHER PUBLICATIONS

Hideki Hirayama et al., "Analysis of Current Injection Efficiency of Separate-Confinement-Heterostructure Quantum Film Lasers", IEEE Journal of Quantum Electronics, vol. 28, Issue 1, Jan. 1992, pp. 68-74.
(Continued)

*Primary Examiner* — Xinning(Tom) Niu
*Assistant Examiner* — Delma R Fordé
(74) *Attorney, Agent, or Firm* — Schwabe, Williamson & Wyatt, P.C.

(57) ABSTRACT

Embodiments of the present disclosure are directed towards a laser device with a stepped graded index separate confinement heterostructure (SCH), in accordance with some embodiments. One embodiment includes a substrate area, and an active region adjacent to the substrate area. The active region includes an SCH layer, which comprises a first portion and a second portion adjacent to the first portion. A composition of the first portion is graded to provide a first conduction band energy increase over a distance from multiple quantum wells (MQW) to a p-side of a laser device junction. A composition of the second portion is graded to provide a second conduction band energy increase over the MQW to the p-side distance. The first conduction band energy increase is different than the second conduction band energy increase. Other embodiments may be described and/or claimed.

20 Claims, 5 Drawing Sheets

(51) Int. Cl.
*H01S 5/20* (2006.01)
*H04B 10/40* (2013.01)
*H01S 5/10* (2006.01)
*H01S 5/223* (2006.01)
H01S 5/042 (2006.01)
H01S 5/40 (2006.01)
H01S 5/022 (2006.01)
H01S 5/02 (2006.01)
H01S 5/00 (2006.01)

(52) U.S. Cl.
CPC ......... *H01S 5/04257* (2019.08); *H01S 5/2063* (2013.01); *H01S 5/4012* (2013.01); *H01S 5/4031* (2013.01); *H01S 2301/176* (2013.01)

(56) References Cited

U.S. PATENT DOCUMENTS

2016/0094014 A1* 3/2016 Shin ................ H01S 5/2031
372/45.01
2017/0155230 A1* 6/2017 Nakatsu ............ H01S 5/34333

OTHER PUBLICATIONS

Juan A. Martin et al., "Comparison between a graded and step-index optical cavity in InGaN MQW laser diodes", Semiconductor Science and Technology, vol. 20, No. 3, (2005), 7 pages.

* cited by examiner

LASER DEVICE WITH A STEPPED GRADED INDEX SEPARATE CONFINEMENT HETEROSTRUCTURE

FIELD

Embodiments of the present disclosure generally relate to the field of increasing efficiency in multiple quantum well lasers with a separate confinement heterostructure.

BACKGROUND

Semiconductor lasers may be used as components in optical transceivers for digital communications products. For example, silicon photonic chips use on-chip lasers as optical sources for digital transmission. It may be useful for the lasers, and in particular for multiple quantum wells (MQW) lasers, to operate within as small an electrical power budget as possible, while providing sufficient optical power to span the communication link with low bit-error rate. The efficiency of the laser may therefore be important for the competitiveness of the overall transmitter.

For example, in the hybrid silicon laser technology, the efficiency of the laser depends on the design of the III-V active region gain material, which is bonded to the silicon substrate of the laser device. It is important that the laser design encompass high confinement of electrical carriers as well as the optical mode near the multiple quantum wells. For this purpose it is typical to introduce a separate confinement heterostructure (SCH) in MQW lasers. The SCH typically includes additional p-type and n-type layers with lower refractive indexes than the central p-type and n-type layers of the active region of MQW lasers, to provide effective optical confinement. Accordingly, the SCH typically combines low optical index for optical confinement with high bandgap for electrical confinement.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
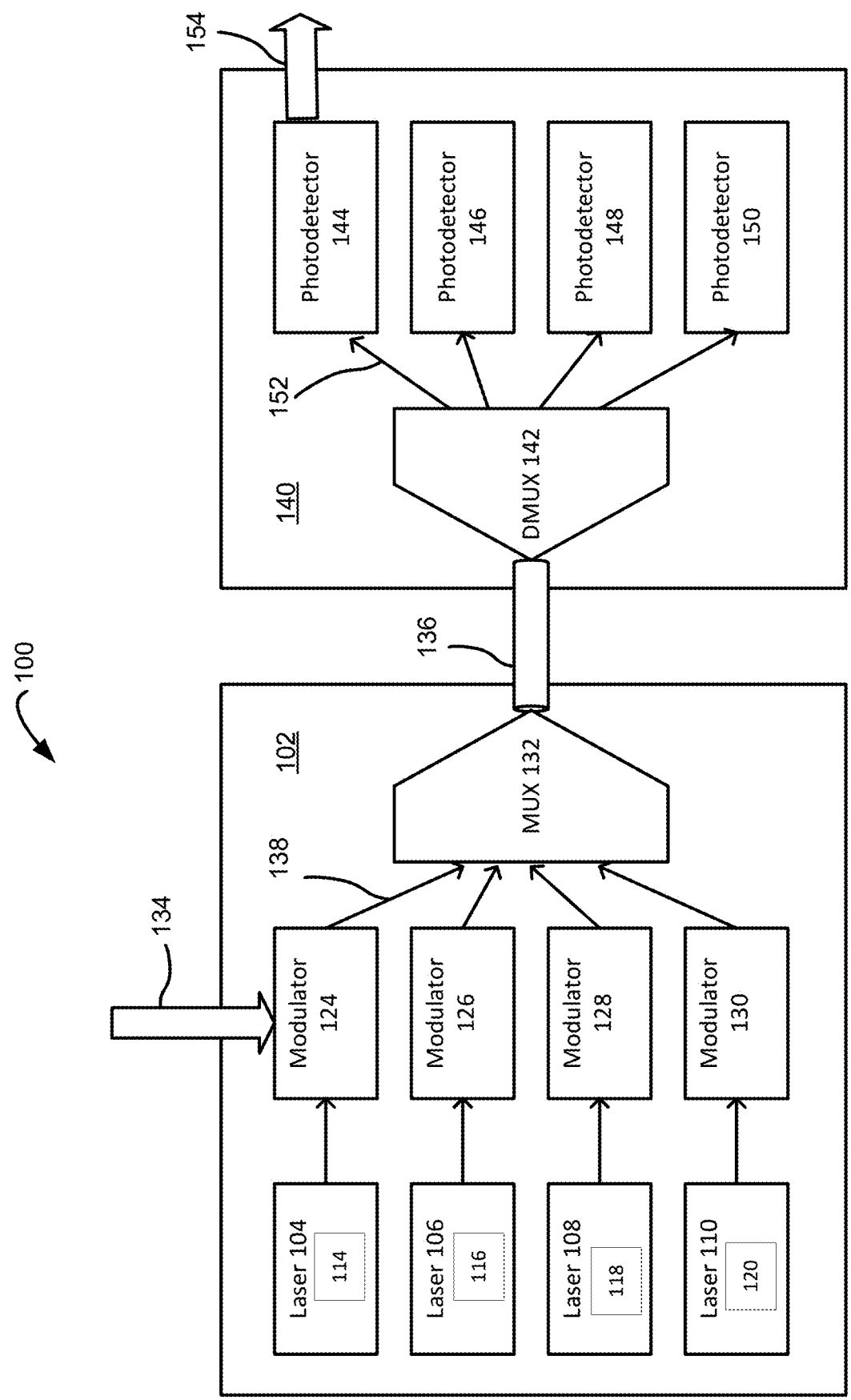
FIG. 1 is an example communication system that utilizes a laser device with a stepped graded index SCH, in accordance with some embodiments.

Embodiments of the present disclosure describe techniques and configurations for a laser device with a stepped graded index SCH, in accordance with some embodiments. In embodiments, the laser device includes a substrate (e.g., silicon on insulator (SOI)) area, and an active region adjacent to the substrate area. The active region includes a separate confinement heterostructure layer, which comprises a first portion and a second portion adjacent to the first portion.

A composition of the first portion is graded to provide a first conduction band energy increase over a distance from MQW to a p-side of a laser device junction. A composition of the second portion is graded to provide a second conduction band energy increase over the distance from the MQW to the p-side of the laser device junction. The first conduction band energy increase over the distance from the MQW to the p-side is different than the second conduction band energy increase over the distance from the MQW to the p-side. In embodiments, the laser device may comprise an MQW laser.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is an example communication system that utilizes a laser device with a stepped graded index SCH, in accordance with some embodiments. The system 100 includes a transmitter chip 102, configured to transmit data to a receiver chip 140. In embodiments, the transmitter chip 102 comprises a photonic integrated circuit (IC) with one or more on-chip laser devices 104, 106, 108, 110. In embodiments, one or more of the laser devices 104, 106, 108, 110 may include SCH layers (e.g., SCH structures 114, 116, 118, 120 respectively) provided according to a stepped graded index design, in accordance with embodiments described herein. It will be understood that the number of on-chip laser devices may vary according to technological needs and constraints; the laser devices 104, 106, 108, 110 with respective stepped graded index SCH structures 114, 116, 118, 120 are shown for purposes of illustration.

In embodiments, the transmitter chip 102 may further include optical modulators 124, 126, 128, 130 optically coupled with the laser devices 104, 106, 108, 110 respectively. The outputs of the modulators 124, 126, 128, 130 may couple with a multiplexer (MUX) 132. It should be understood that the chip 102 (and receiver chip 140) may include other components (e.g., processors, memory, etc.) that are not shown herein for ease of explanation.

In operation, the optical signals provided by the laser devices 104, 106, 108, 110 may be modulated with electronic data inputs, provided to the modulators (one of the electronic data inputs 134, provided to the modulator 124, is shown for purposes of clarity). The optical signals carrying the data information (e.g., 138) may be multiplexed by the multiplexer 132 and the resulting data signal may be provided to an optical data communication channel 136 (e.g., optical fiber cable) for transmission. In embodiments, the length of the optical channel 136 may vary, e.g., from a few meters to a few kilometers.

On the receiver chip 140 side, the optical signal may be de-multiplexed by the demultiplexer (DMUX) 142, and de-multiplexed optical data signals (e.g., 152) may be provided to respective photodetectors 144, 146, 148, 150. The photodetectors 144, 146, 148, 150 may convert received optical data signals into an electronic form and provide resulting electronic data signals (e.g., 154) for further processing.

In embodiments, the lasers with stepped graded index SCH (e.g., laser 104 with SCH 114) according to the embodiments described herein provide for increased communication speed, lower power consumption, higher confinement, and higher injection efficiency compared to existing solutions. In addition or in the alternative to the example system 100 described above, the lasers with stepped graded index SCH may be used in optical transceivers, Light Detection and Ranging (LIDAR), optical and quantum computing systems, and the like.

Figure 2:
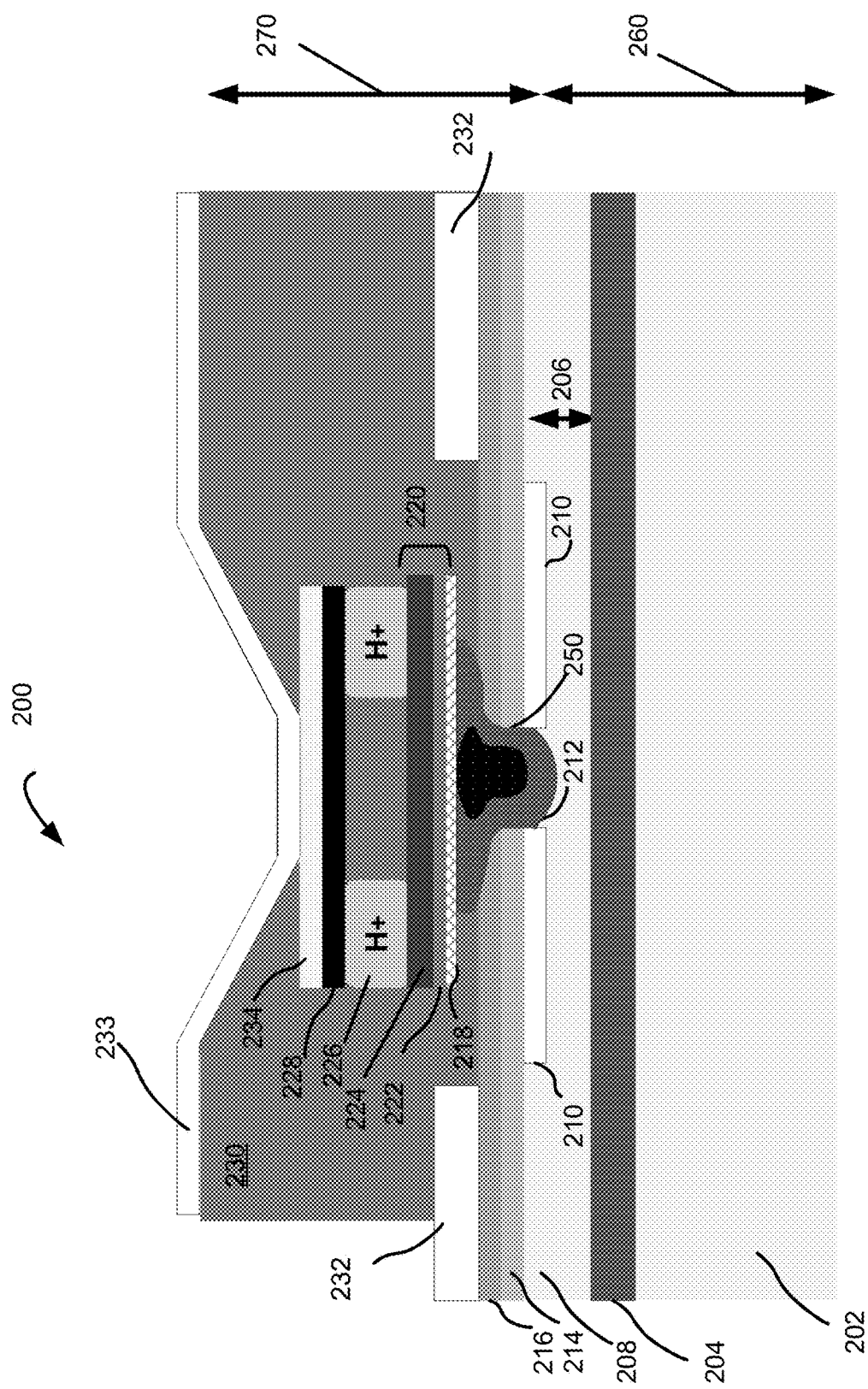
FIG. 2 is a front cross-section view of an example structure of a laser device with a stepped graded index SCH, in accordance with some embodiments.

FIG. 2 is a front cross-section view of an example structure of a laser device with a stepped graded index SCH, in accordance with some embodiments.

The structure of the laser device 200 may include a substrate (e.g., silicon on insulator (SOI)) area 260 and a III-V active region 270 disposed adjacent to (e.g., on) the SOI area 260. The SOI area 260 may include multiple layers, some of which are described below. The SOI area 260 may include a substrate layer 202 comprising a substrate material of the SOI wafer (e.g., silicon). A buried oxide layer (BOX) 204 is provided on the substrate layer 202 for vertical optical confinement of the laser device 200. An optical waveguiding layer 206 is provided on the BOX layer 204. In embodiments, the optical waveguiding layer 206 may include silicon layer 208 with air gap 210 and silicon rib 212.

The III-V active region 270 includes an n-contact layer 214 provided on the optical waveguiding layer 206. In embodiments, the n-contact layer 214 may comprise the Indium-Phosphide/Indium-Gallium-Aluminum-Arsenide (InP/InGaAsP) semiconductor material. The region 270 may further include an n-type region 216 provided on the n-contact layer 214. The n-type region 216 may comprise InP material.

The region 270 may further include multiple quantum wells (MQW) 218 for stimulated emission of light 250 within the laser 200. The MQW 218 may comprise Aluminum-Gallium-Indium-Arsenide (AlGaInAs).

In embodiments, the region 270 may further include an SCH layer 220 disposed adjacent the MQW 218 for confinement of electrons near the MQW 218 and vertical confinement of the optical mode. SCH layer 220 may comprise AlGaInAs material. It should be noted that the material compositions for the region 270 are provided by way of example. Other suitable materials may be used for n-contact layer, MQW, SCH, and other components of the active region of the laser device 200.

In embodiments, the SCH layer 220 is divided into two portions, first portion 222 and second portion 224, which may be disposed adjacent to (e.g., on top of) first portion 222. Compositions of each portion may be provided to have the portions be graded differently from each other. In embodiments, the first and second portions 222 and 224 may be graded linearly or in some other manner, e.g., non-linearly, such as, for example, parabolically. In the context of SCH layer, grading means gradual change of the composition to accomplish grading of the optical index and conduction band edge or overall bandgap of the material of the SCH layer.

For example, the first portion 222 (lower portion of the SCH layer 220 in FIG. 2) may be steeply graded, providing rapid increase of the laser's conduction band energy over distance from n-side (e.g., n-type region 216) to p-side (e.g., p-type region 226 described below) of the laser device 200 junction. The second portion 224 (upper portion) may be shallowly graded, compared to the first portion, providing slower increase of the laser's conduction band energy over a distance from MQW into the p-side of the laser device 200 junction), compared to the grading of the first portion 222. In other words, the SCH layer 220 may be stepped graded (e.g., in a linear manner), the first portion 222 being the first grading step, and the second portion 224 being the second grading step.

For example, the stepped graded SCH layer 220 may be graded as follows. The steep graded portion (e.g., first portion 222) may have a thickness of about 20 nm, and may be graded from a bandgap of 1.292 eV to 1.390 eV. The shallow graded portion (second portion 224) may have a thickness of about 100 nm, and may be graded from a bandgap of 1.390 eV to 1.415 eV.

It will be understood that the above thicknesses and grading values are provided by way of an example. Different thicknesses and grades of first and second portions 222 and 224 may be contemplated and used, depending on particular technological demands to the laser device 200.

For example, the SCH layer 220 may have overall thickness of about 200 nm, wherein the first portion 222 may have thickness of about 50 nm and the second portion 224 may have thickness of about 150 nm. In embodiments, the desired stepped (linearly) graded SCH layer 220 may be produced by managing the growth of the layer, such as by varying the composition of the material as the layer is fabricated. The stepped linearly graded SCH layer will be explained in further detail in reference to FIG. 3.

In embodiments, the region 270 further includes a p-type region 226 of the laser, which may comprise p-doped Indium-Phosphide (p-InP) cladding layer. The region 270 further includes a p-contact layer 228 (e.g., P-InGaAs) disposed on top of the p-type region 226, an insulation layer 230 disposed on top of the p-contact layer 228, and a metal layer 234 disposed between the contact layer 228 and the insulation layer 230, as shown.

The laser device 200 also includes metal contacts 232 and 233. Specifically, metal contact 232 (N-pad) is disposed on the n-type region 216, at least partially inside the insulation layer 230, as shown. The metal contact 233 (P-pad) is disposed on top of the p-contact layer 228 and partially inside the insulation layer 230, as shown.

Figure 3:
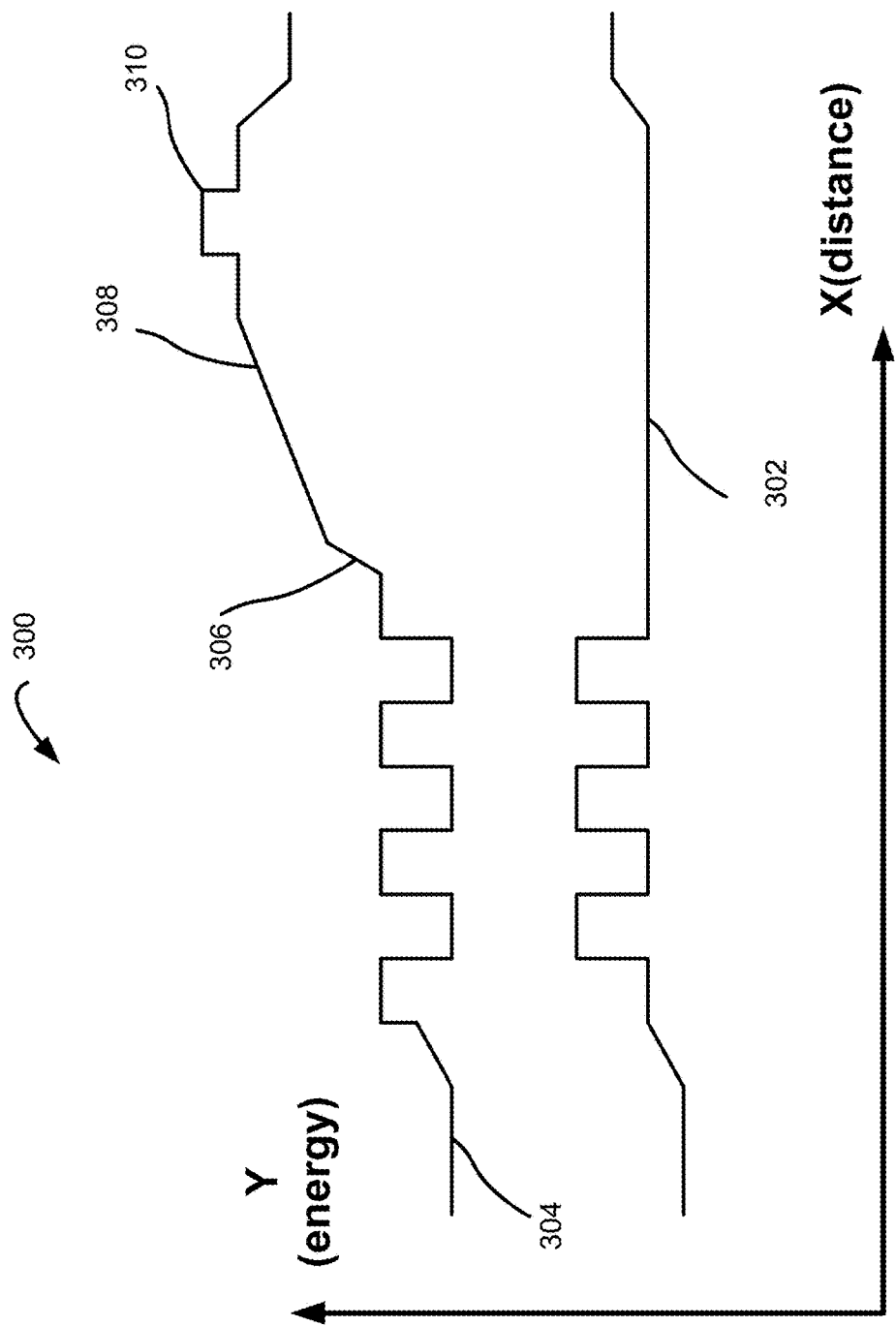
FIG. 3 is an example diagram illustrating energy band edges in a semiconductor material provided by a laser device with a stepped graded index SCH, in accordance with some embodiments.

FIG. 3 is an example diagram illustrating energy band edges in a semiconductor material provided by a laser device with a stepped graded index SCH, in accordance with some embodiments. Specifically, diagram 300 shows valence band energy curve 302 and conduction band energy curve 304 respectively, provided by the stepped graded index design of the SCH layer of the laser of FIG. 2. The vertical axis Y reflects band energy (not to scale), and the horizontal axis X reflects distance from MQW to p-side of the laser device junction (not to scale). The bandgap of the semiconductor material is engineered to provide the change in conduction band and valence band energy of the III-V material around the quantum wells and p-SCH of the laser device 200, moving from bottom (left side on x axis) to top (right side on x axis).

Existing solutions include several varieties of the SCH layer design, such as step-index, graded, and parabolic. Step-index typically can offer high carrier confinement, particularly for a small number of quantum wells employed in the laser structure. However, the step-index structure causes a "notch" in the valence band due to the discontinuity between the MQW region and the SCH. This "notch" can hamper the injection of holes, increasing resistance and contributing to Joule heating, which then can reduce the laser's wall-plug efficiency. This "notch" also acts like a well for holes, leading to high recombination current at the interface which further reduces injection efficiency.

Linearly graded and parabolically graded SCH designs provide for the funneling of hot electrons back to the MQW as they lose energy, and avoid the "notch" described above. However, these designs are accompanied by reduced confinement and a shallow graded bandgap, particularly near the MQW, which can allow more carriers to escape the MQW region.

In order to achieve high confinement as well as to avoid a large valence band "notch" and its associated resistance penalty, a stepped graded index design according to the embodiments described herein can be employed. As discussed with reference to FIG. 2, the first portion 222 of the SCH layer 220 (FIG. 2) is graded to provide with a steep (e.g., near-vertical) conduction band edge portion 306, without introducing a large valence-band notch as would be the case for a stepped index design. For example, the first portion 222 may provide a much larger change in bandgap over the first 20 nm than over the remaining thickness of the second portion 224 (referencing FIG. 2). For example, in some embodiments, the band edge portion 306 may be near-vertical relative to the axis X. Accordingly, the first portion 222 of the SCH layer 220 accomplishes high confinement.

The second portion 224 of the SCH layer 220 (disposed adjacent to first portion 222 as shown in FIG. 2) is compositionally graded to achieve a less steep, but still sloped conduction band edge portion 308. For example, as described above, the steep graded portion (first portion 222) may have a thickness of about 20 nm, and may be graded from a bandgap of 1.292 eV to 1.390 eV. The shallow graded portion (second portion 224) may have a thickness of about 100 nm, and may be graded from a bandgap of 1.390 eV to 1.415 eV. That corresponds to a change of 0.098 eV/20 nm, or 4.9 meV/nm for the steep portion, and 0.025 eV/100 nm, or 0.25 eV/nm for the shallow portion. In other words, the gradient of the band edge portion 306 is greater than the gradient of the band edge portion 308.

The composition of differently graded portions of the SCH as described herein provides additional carrier recovery by funneling hot carriers back to the MQW as they lose energy. In embodiments, an electron blocking layer or layers may be added for additional confinement, resulting in a notch 310 in the conduction band edge 304

The example embodiments described in reference to FIG. 3 provide for linear grading of first and second portions of the SCH layer 220. However, stepped linear grading of the individual portions of the SCH layer are described for purposes of explanation. The individual portions 222 and 224 may be graded in a different manner. For example, the individual portions 222 and 224 may be stepped parabolically graded, or they may be stepped with linear and parabolic grading respectively, or vice versa, or the like.

The SCH stepped grade design described herein provides for the numerous advantages compared to existing solutions. For example, the laser with stepped graded index SCH design provides for low resistance and interface recombination by avoiding a "notch" at the MQW/SCH interface, together with high confinement and efficient hot carrier recovery. Accordingly, high laser efficiency at high power together with low resistance for high wall-plug efficiency may be accomplished with the lasers according to the embodiments described herein.

In summary, the laser device with the SCH stepped linear grade design provided according to the embodiments described herein can combine high injection efficiency, high confinement, and low resistance, enabling highly efficient operation even at high bias currents and optical powers.

Figure 4:
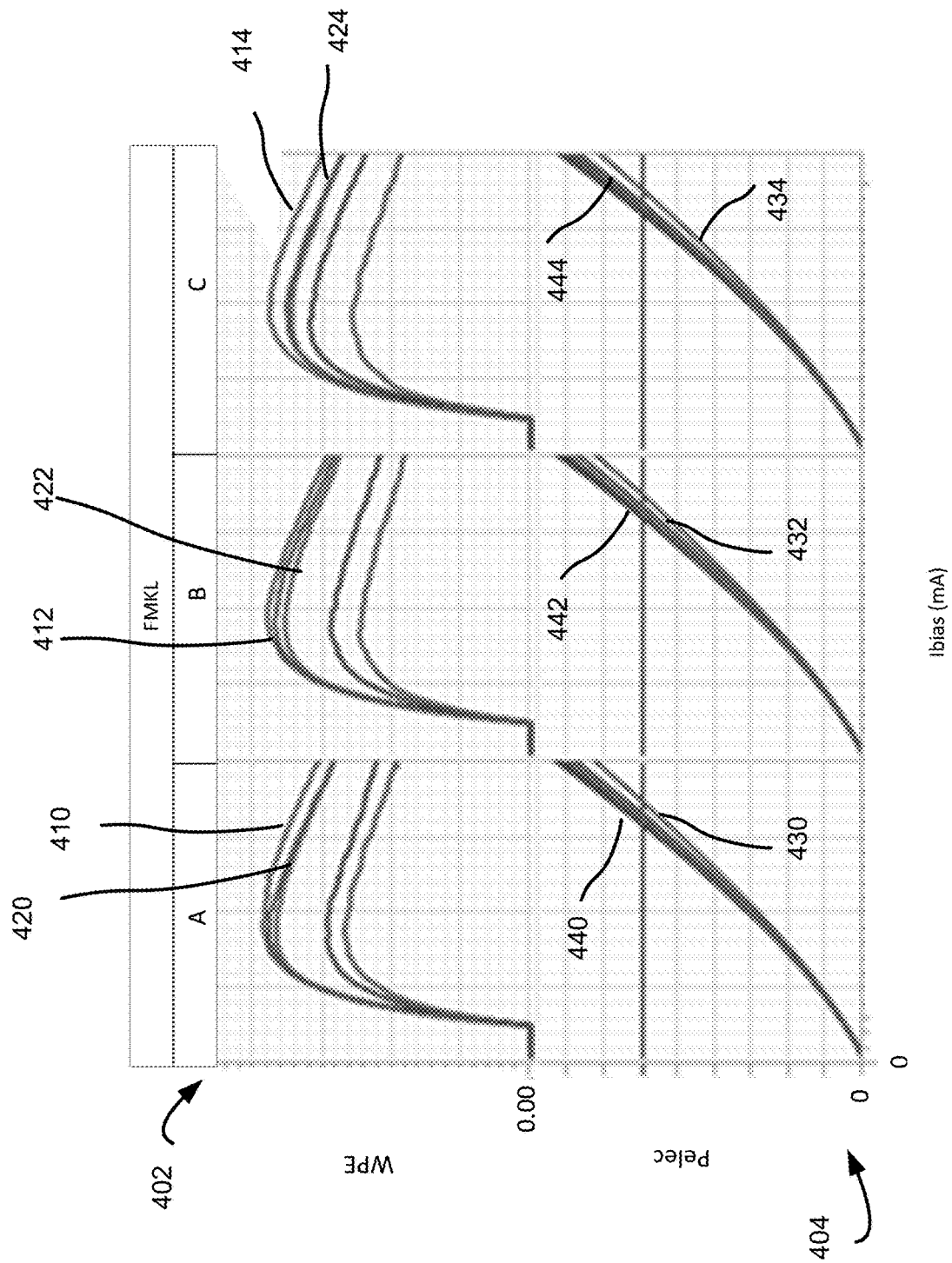
FIG. 4 is an example experimental data indicating wall-plug efficiency and electrical power consumption of the laser with a stepped graded index SCH, in accordance with some embodiments.

FIG. 4 is an example experimental data indicating wall-plug efficiency and electrical power consumption of the laser with a stepped graded index SCH, in accordance with some embodiments. The example data is shown in comparison to the linear graded index SCH laser data collected across various design parameters.

The upper graph 402 illustrates the wall-plug efficiency (WPE) as a function of the bias current Ibias, for different designs of the epitaxial material and different front mirror kappa*length product (FMKL). In the graph 402, curves 410, 412, and 414 are provided for a laser device with the stepped graded index SCH layer, according to the embodiments described herein. Curves 420, 422, and 424 are provided for a laser device with a conventional linear graded index SCH design.

The lower graph 404 indicates the electrical power consumption (Pelec) as a function of the bias current Ibias, for different designs of the epitaxial material. In the graph 404, curves 430, 432, and 434 are provided for a laser device with the stepped graded index SCH layer, according to the embodiments described herein. Curves 440, 442, and 444 are provided for a laser device with a conventional linear graded index SCH design. As can be seen from the comparison of the curves 410, 412, and 414 with the curves 420, 422, and 424 respectively, the laser devices with the stepped graded index SCH design have higher wall-plug efficiency than the laser devices with conventional linear graded index SCH design. Further, as can be seen from the comparison of the curves 430, 432, and 434 with the curves 440, 442, and 444 respectively, the laser devices with the stepped graded index SCH design have lower electrical power consumption than the laser devices with conventional linear graded index SCH design.

Figure 5:
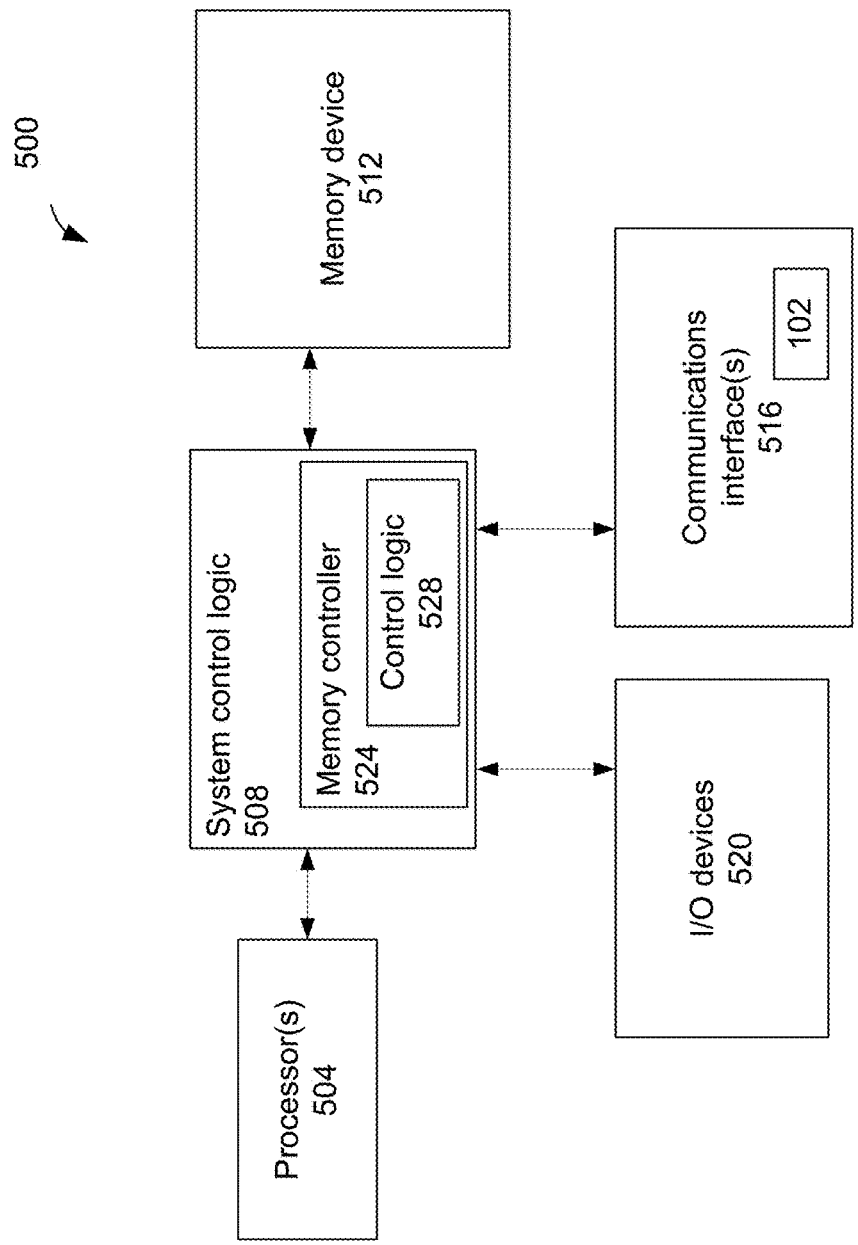
FIG. 5 schematically illustrates an example computing device including a laser device with a stepped graded index SCH, in accordance with some embodiments.

FIG. 5 schematically illustrates an example computing device including a laser device with a stepped graded index SCH, in accordance with some embodiments.

The computing device 500 includes system control logic 508 coupled to one or more processor(s) 504; a memory device 512; one or more communications interface(s) 516; and input/output (I/O) devices 520. The memory device 512 may be a non-volatile computer storage chip (e.g., provided on the die). The memory device 512 may be configured to be removably or permanently coupled with the computing device 500.

Communications interface(s) 516 may provide an interface for computing device 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network. In embodiments, communication interface(s) 516 may include, or couple with, a transceiver, such as transmitter chip 102 of FIG. 1, including one or more laser devices (e.g., 104, 106, 108, 110) with SCH stepped graded index design, according to the embodiments described herein.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 524 to provide an interface to the memory device 512 to control various memory access operations. The memory controller 524 may include control logic 528 that may be specifically configured to control access of the memory device 512.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard.

In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 516 to communicate with components of a positioning network, e.g., a global positioning system (GPS) satellite.

In various embodiments, the computing device 500 may be a mobile computing device such as, but not limited to, a laptop computing device, a tablet computing device, a netbook, a smartphone, etc.; a desktop computing device; a workstation; a server; etc. The computing device 500 may have more or fewer components, and/or different architectures. In further implementations, the computing device 500 may be any other electronic device that processes data.

According to various embodiments, the present disclosure describes a number of examples.

Example 1 is a laser device, comprising: a substrate, and an active region adjacent to the substrate, wherein the active region includes a separate confinement heterostructure (SCH) layer, which comprises a first portion and a second portion adjacent to the first portion. A composition of the first portion is graded to provide a first conduction band energy increase over a distance from multiple quantum wells (MQW) to a p-side of a laser device junction, and a composition of the second portion is graded to provide a second conduction band energy increase over the distance from the MQW to the p-side of the laser device junction. The first conduction band energy increase over the distance from the MQW to the p-side is different than the second conduction band energy increase over the distance from the MQW to the p-side.

Example 2 includes the laser device of Example 1, wherein the first portion is linearly graded.

Example 3 includes the laser device of Example 1, wherein the second portion is linearly graded.

Example 4 includes the laser device of Example 1, wherein the first portion has a thickness of about 20 nm, and is graded from 1.292 eV to 1.390 eV.

Example 5 includes the laser device of Example 4, wherein the second portion has a thickness of about 100 nm, and is graded from 1.390 eV to 1.415 eV.

Example 6 includes the laser device of Example 1, wherein the laser device is a multiple quantum well (MQW) laser.

Example 7 includes the laser device of Example 1, wherein the first conduction band energy increase over the distance from the MQW to the p-side of the laser device is greater than the second conduction band energy increase over the distance from the MQW to the p-side of the laser device.

Example 8 includes the laser device of Example 1, wherein the SCH layer comprises Aluminum-Gallium-Indium-Arsenide (AlGaInAs) material.

Example 9 includes the laser device of any of Examples 1 to 8, wherein the laser device comprises an integrated circuit.

Example 10 includes a computing device, comprising: a processor, and a communication interface coupled with the processor to provide data communication for the processor, wherein the communication interface includes a transceiver with a laser device to provide the data communication. The laser device includes a substrate area and an active region adjacent to the substrate area. The active region includes a separate confinement heterostructure (SCH) layer, which comprises a first portion and a second portion adjacent to the first portion, wherein a composition of the first portion is graded to provide a first conduction band energy increase over a distance from multiple quantum wells (MQW) to a p-side of a laser device junction, and a composition of the second portion is graded to provide a second conduction band energy increase over the distance from the MQW to the p-side of the laser device junction. The first conduction band energy increase over the distance from the MQW to the p-side is greater than the second conduction band energy increase over the distance from the MQW to the p-side.

Example 11 includes the computing device of Example 10, wherein the first portion is linearly graded.

Example 12 includes the computing device of Example 11, wherein the second portion is linearly graded.

Example 13 includes the computing device of Example 10, wherein the laser device is a multiple quantum well (MQW) laser.

Example 14 includes the computing device of Example 10, wherein the transceiver comprises an integrated circuit.

Example 15 includes the computing device of any of Examples 10 to 14, wherein the computing device comprises one of: a laptop, a server, or a desktop.

Example 16 includes an integrated circuit, comprising a laser device to provide the data communication. The laser device includes a silicon on insulator (SOI) area and an active region adjacent to the SOI area. The active region includes a separate confinement heterostructure (SCH) layer, which comprises a first portion and a second portion adjacent to the first portion. A composition of the first portion is graded to provide a first conduction band energy increase, and a composition of the second portion is graded to provide a second conduction band energy increase. A first gradient of the first conduction band energy is greater than a second gradient of the second conduction band energy.

Example 17 includes the integrated circuit of Example 16, wherein the first portion is linearly graded.

Example 18 includes the integrated circuit of Example 17, wherein the first portion has a thickness of about 20 nm, and is graded from 1.292 eV to 1.390 eV.

Example 19 includes the integrated circuit of any of Examples 16 to 18, wherein the second portion is linearly graded.

Example 20 includes the integrated circuit of Example 19, wherein the second portion has a thickness of about 100 nm, and is graded from 1.390 eV to 1.415 eV.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A laser device, comprising:
   a substrate; and
   an active region adjacent to the substrate, wherein the active region includes:
   a multiple quantum wells (MQW) layer; and
   a separate confinement heterostructure (SCH) layer disposed on the MQW layer, wherein the SCH layer comprises a first portion and a second portion adjacent to the first portion, wherein a composition of the first portion is graded to provide a first conduction band energy increase over a distance from the MQW to a p-side of a laser device junction, and a composition of the second portion is graded to provide a second conduction band energy increase over the distance from the MQW to the p-side of the laser device junction, wherein the first conduction band energy increase over the distance from the MQW to the p-side is different than the second conduction band energy increase over the distance from the MQW to the p-side, wherein a first gradient of a first curve corresponding to the first conduction band energy increase is greater than a second gradient of a second curve corresponding to the second conduction band energy increase.

2. The laser device of claim 1, wherein the first portion is linearly graded.

3. The laser device of claim 1, wherein the second portion is linearly graded.

4. The laser device of claim 1, wherein the first portion has a thickness of about 20 nm, and is graded from 1.292 eV to 1.390 eV.

5. The laser device of claim 4, wherein the second portion has a thickness of about 100 nm, and is graded from 1.390 eV to 1.415 eV.

6. The laser device of claim 1, wherein the laser device is a multiple quantum well (MQW) laser.

7. The laser device of claim 1, wherein the first conduction band energy increase over the distance from the MQW to the p-side of the laser device is greater than the second conduction band energy increase over the distance from the MQW to the p-side of the laser device.

8. The laser device of claim 1, wherein the SCH layer comprises aluminum-gallium-indium-arsenide (AlGaInAs) material.

9. The laser device of claim 1, wherein the laser device comprises an integrated circuit.

10. A computing device, comprising:
    a processor; and a communication interface coupled with the processor to provide data communication for the processor, wherein the communication interface includes a transceiver with a laser device to provide the data communication, wherein the laser device includes a substrate area and an active region adjacent to the substrate area, wherein the active region includes a multiple quantum wells (MQW) layer; and a separate confinement heterostructure (SCH) layer disposed on the MQW layer, wherein the SCH layer comprises a first portion and a second portion adjacent to the first portion, wherein a composition of the first portion is graded to provide a first conduction band energy increase over a distance from the MQW to a p-side of a laser device junction, and a composition of the second portion is graded to provide a second conduction band energy increase over the distance from the MQW to the p-side of the laser device junction, wherein the first conduction band energy increase over the distance from the MQW to the p-side is greater than the second conduction band energy increase over the distance from the MQW to the p-side, wherein a first gradient of a first curve corresponding to the first conduction band energy increase is greater than a second gradient of a second curve corresponding to the second conduction band energy increase.

11. The computing device of claim 10, wherein the first portion is linearly graded.

12. The computing device of claim 11, wherein the second portion is linearly graded.

13. The computing device of claim 10, wherein the laser device is a multiple quantum well (MQW) laser.

14. The computing device of claim 10, wherein the transceiver comprises an integrated circuit.

15. The computing device of claim 10, wherein the computing device comprises one of: a laptop, a server, or a desktop.

16. An integrated circuit, comprising:
a laser device to provide data communication, wherein the laser device includes: a silicon on insulator (SOI) area; and
an active region adjacent to the SOI area, wherein the active region includes a multiple quantum wells (MQW) layer; and a separate confinement heterostructure (SCH) layer disposed on the MQW layer, wherein the SCH layer comprises a first portion and a second portion adjacent to the first portion, wherein a composition of the first portion is graded to provide a first conduction band energy increase, and a composition of the second portion is graded to provide a second conduction band energy increase, wherein a first gradient of a first curve corresponding to the first conduction band energy is greater than a second gradient of a second curve corresponding to the second conduction band energy increase.

17. The integrated circuit of claim 16, wherein the first portion is linearly graded.

18. The integrated circuit of claim 17, wherein the first portion has a thickness of about 20 nm, and is graded from 1.292 eV to 1.390 eV.

19. The integrated circuit of claim 16, wherein the second portion is linearly graded.

20. The integrated circuit of claim 19, wherein the second portion has a thickness of about 100 nm, and is graded from 1.390 eV to 1.415 eV.

* * * * *